(12) United States Patent
Huang

(10) Patent No.: US 11,385,685 B2
(45) Date of Patent: Jul. 12, 2022

(54) SUPPORTING LAYER, DISPLAY DEVICE AND MANUFACTURE METHOD THEREOF

(71) Applicant: Yungu (Gu'an) Technology Co., Ltd., Langfang (CN)

(72) Inventor: Hua Huang, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 205 days.

(21) Appl. No.: 16/779,862

(22) Filed: Feb. 3, 2020

(65) Prior Publication Data
US 2020/0174519 A1    Jun. 4, 2020

Related U.S. Application Data

(63) Continuation of application No. PCT/CN2019/088555, filed on May 27, 2019.

(30) Foreign Application Priority Data

Aug. 10, 2018    (CN) .......................... 201810909601.2

(51) Int. Cl.
 G06F 1/16    (2006.01)
 H04M 1/02    (2006.01)

(52) U.S. Cl.
 CPC ............ *G06F 1/166* (2013.01); *G06F 1/1652* (2013.01); *H04M 1/0268* (2013.01)

(58) Field of Classification Search
 None
 See application file for complete search history.

(56) References Cited

U.S. PATENT DOCUMENTS 9,827,742 B2    11/2017    Kim et al.
2006/0054594 A1*    3/2006    Lifka .................. H01L 21/6835
                                                            216/41

(Continued)

FOREIGN PATENT DOCUMENTS

CN    1519626 A    8/2004
CN    201217420 Y    4/2005

(Continued)

OTHER PUBLICATIONS

PCT International Search Report of PCT/CN2019/088555 dated Aug. 30, 2019.

(Continued)

*Primary Examiner* — James Wu
*Assistant Examiner* — Christopher L Augustin
(74) *Attorney, Agent, or Firm* — Ladas & Parry LLP

(57) ABSTRACT

A supporting layer, a display device and a manufacture method of the display device are provided by the present application. The display device includes: a flexible screen device and a supporting layer. The flexible screen device is located on a side of the supporting layer, and the supporting layer is provided with at least one hollowed-out area for releasing an impact force when the flexible screen device is subjected to the impact force. In embodiments of the present application, by attaching a supporting layer with a plurality of hollowed-out areas to a flexible screen device, an impact force can be dispersed and buffered when the flexible screen device is impacted by a heavy object, damage to display components due to stress concentration can be avoided, thereby avoiding malfunction or failure of the flexible screen device.

19 Claims, 3 Drawing Sheets

(56) References Cited

U.S. PATENT DOCUMENTS

| | | | | |
|---|---|---|---|---|
| 2006/0207967 A1* | 9/2006 | Bocko | .................... | G02F 1/1333 |
| | | | | 216/24 |
| 2017/0133469 A1* | 5/2017 | Woo | ...................... | H01L 29/167 |
| 2018/0134007 A1* | 5/2018 | Lee | ......................... | B32B 25/08 |
| 2018/0315636 A1* | 11/2018 | Chen | ...................... | B32B 17/06 |

FOREIGN PATENT DOCUMENTS

| | | | |
|---|---|---|---|
| CN | 103429016 A | 12/2013 | |
| CN | 103681759 A | 3/2014 | |
| CN | 103927941 A | 7/2014 | |
| CN | 104134660 A | 11/2014 | |
| CN | 104323663 A | 2/2015 | |
| CN | 104733507 A | 6/2015 | |
| CN | 204491985 U | 7/2015 | |
| CN | 105609006 A | 5/2016 | |
| CN | 107067979 A | 8/2017 | |
| CN | 107554017 A | 1/2018 | |
| CN | 108054173 A | 5/2018 | |
| CN | 108230907 A | 6/2018 | |
| CN | 109036136 A | 12/2018 | |
| WO | 2014137113 A1 | 9/2014 | |

OTHER PUBLICATIONS

PCT Written Opinion of PCT/CN2019/088555 dated Aug. 30, 2019.
Chinese First Office Action for CN Application No. 201810909601.2 dated Aug. 5, 2019.
Chinese Refusal Decision for CN Application No. 201810909601.2 dated Jul. 14, 2020.
Chinese Second Office Action for CN Application No. 201810909661.2 dated Dec. 26, 2019.

\* cited by examiner

SUPPORTING LAYER, DISPLAY DEVICE AND MANUFACTURE METHOD THEREOF

CROSS-REFERENCE TO RELATED APPLICATIONS

This application is a continuation application of International Application No. PCT/CN2019/088555, filed on May 27, 2019 which claims priority to CN Patent Application No. 201810909601.2, filed on Aug. 10, 2018. All of the aforementioned applications are hereby incorporated by reference in their entireties.

TECHNICAL FIELD

The present application relates to the field of display, and particularly to a supporting layer, a display device and a manufacture method thereof.

BACKGROUND

When an existing flexible screen device is impacted by external force violently, a stress concentration phenomenon occurs in an area impacted by the external force, resulting in damage to components below the area and a poor display phenomenon such as black spots, bright spots, colorful spots, or the like in the screen.

SUMMARY

In view of this, a supporting layer, a display device and a manufacture method thereof are provided by the present application. Here, an impact stress can be dispersed and buffered when a heavy object impacts the flexible screen device, and damage or failure of the display device due to the impact stress can be avoided either.

In one embodiment, a supporting layer is provided by the present application. The supporting layer is used to be attached to a side of a flexible screen device, and is provided with at least one hollowed-out area which is used to release an impact force when the flexible screen device is subjected to the impact force.

In one embodiment, a display device is provided by the present application. The display device includes a flexible screen device and the supporting layer according to the first aspect. The supporting layer is attached to a side of the flexible screen device.

In one embodiment, a manufacture method of a display device is provided by the present application. The manufacture method of a display device includes preparing a supporting layer; preparing at least one hollowed-out area on the supporting layer; providing a flexible screen device and attaching the supporting layer provided with the at least one hollowed-out area to a side of the flexible screen device. The at least one hollowed-out area is used to release an impact force when the flexible screen device is subjected to the impact force.

A supporting layer, a display device and a manufacture method thereof are provided by embodiments of the present application. By attaching a supporting layer with a plurality of hollowed-out areas to a flexible screen device, an impact force can be dispersed and buffered when the flexible screen device is impacted by a heavy object, damage to display components due to stress concentration can be avoided, thereby avoiding malfunction or failure of the flexible screen device.

DETAILED DESCRIPTION

A clear and complete description of technical solutions of the embodiments of the present application will be given below, in combination with the accompanying drawings in the embodiments of the present application. Obviously, the embodiments described below are a part, but not all, of the embodiments of the present application. All of other embodiments, obtained by those skilled in the an based on the embodiments of the present application without any inventive efforts, fall into the protection scope of the present application.

A flexible screen device is used widely in a mobile phone, a wearable device, or the like, because the flexible screen device is bendable, foldable, light, thin and small in size. During the use of the flexible screen device, when a heavy object hills on a certain area of the flexible screen device, components within the area will be damaged by an impact force, resulting in a poor display phenomenon.

For example, when a falling ball impacts the screen in a reliability test of the flexible screen device, the impacted area cannot be displayed in full color instantly, and black spots, bright spots, colorful spots or the like appear in the display area.

Therefore, it is necessary to disperse or buffer the stress generated when the heavy object impacts the flexible screen device in order to protect the components.

Figure 1:
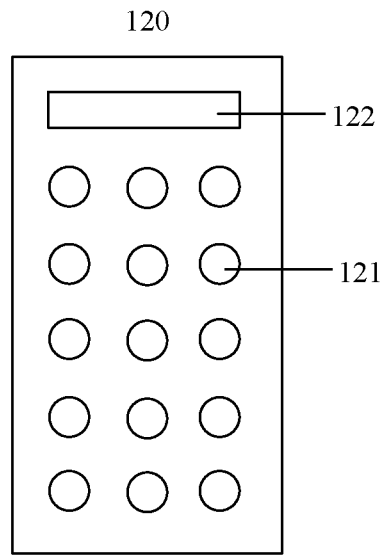
FIG. 1 is a schematic structural diagram of a supporting layer according to an embodiment of the present application.

FIG. 1 is a schematic structural diagram of a supporting layer 120 according to an embodiment of the present application. As shown in FIG. 1, the supporting layer 120 is used to be attached to a side of the flexible screen device. The supporting layer 120 is provided with a plurality of hollowed-out areas which are used to release an impact force when the flexible screen device body is subjected to the impact force.

A supporting layer is provided by an embodiment of the present application. By attaching the supporting layer provided with a plurality of hollowed-out areas to a side of a flexible screen device, an impact force can be dispersed and buffered when the flexible screen device is impacted by a heavy object, damage to display components due to stress concentration can be avoided, thereby avoiding malfunction or failure of the flexible screen device.

Figure 2:
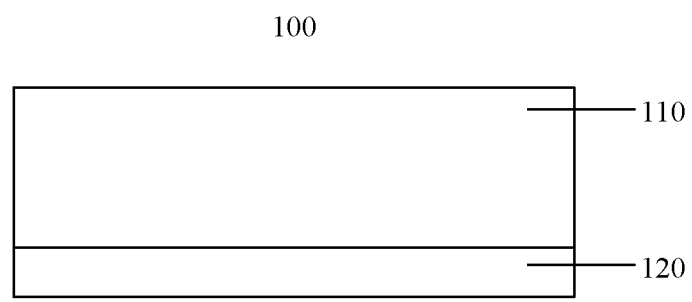
FIG. 2 is a front view of a display device according to an embodiment of the present application.

FIG. 2 is a front view of a display device 100 according to an embodiment of the present application. The display device 100 includes a flexible screen device 110 and a supporting layer 120. The display device 100 is specifically described below with reference to FIG. 1 and FIG. 2.

The flexible screen device 110 is located on a side of the supporting, layer 120. The supporting layer 120 is provided with a plurality of hollowed-out areas which are used to release an impact force when the flexible screen device 110 is subjected to the impact force.

In some embodiments of the present application, a shape of a projection of each of the plurality of hollowed-out areas on an upper surface of the supporting layer 120 is any one of a circle, a rectangle, a triangle, a rhombus, a pentagon, a hexagon and an ellipse.

Specifically, the protection of the hollowed-out area 121 an the upper surface of the supporting layer 120 may also be other regular or irregular shapes, and the present application is not limited thereto.

The flexible screen device 110 may be designed into different shapes according to its bending degree, for example, any shape such as plat, wave, concave, convex, etc.

The flexible screen device 110 may have a laminated structure with multiple layers, for example, including a flexible substrate, an OLED (Organic Light-Emitting Diode) component, and other display components. Among them, the flexible substrate is connected to the supporting layer 120, while the OLEO component and other display components are sequentially stacked on a side of the flexible substrate away from the supporting layer 120. Further, the flexible screen device 110 may further include a cover film attached to a side of the other display components away from the supporting layer 120 to protect components within the flexible screen device 110.

According to an embodiment of the present application, from a side close to the supporting layer 120 to a side far from the supporting layer 120, the laminated structure of the flexible screen device 110 includes a flexible substrate, an OLED layer, a barrier film, a polarizer (POL), an Optical Clear Adhesive (OCA) layer, a Touch Panel (TP), another OCA layer, and a cover film in this order.

In the following, a square hollowed-out area 121 and a spherical heavy object are taken as an example to explain the dispersing and buffering effect of the hollowed-out area 121 on the impact force.

Figure 3:
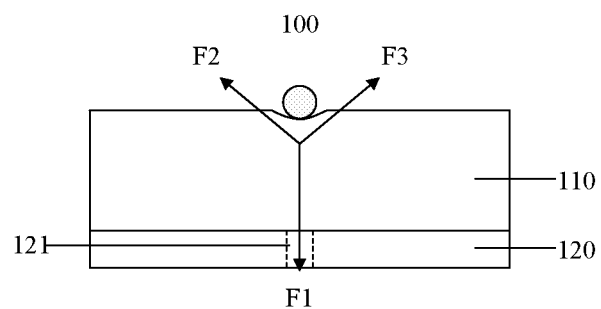
FIG. 3 is a force schematic diagram of a display device according to an embodiment of the present application when the display device is impacted by a heavy object.

Referring to FIG. 3, when the heavy object impacts the flexible screen device 110, due to existence of the hollowed-out area 121, downward deformation may be formed in an impacted portion of the flexible screen device 110 (that is, in a space where the hollowed-out area 121 is located) to buffer part of the impact force. At this time, the flexible screen device 110 is subjected to an impact stress F1, which is smaller than an impact stress generated when there is no supporting layer or the supporting layer is not provided with the hollowed-out area 121, so the supporting layer 120 can buffer the impact stress.

In addition, on a boundary of the hollowed-out area 121, reaction force of the impact stress F1 may be generated, that is, reverse stresses F2, F3, F4, and F5 may be generated on four sides of the hollowed-out 121 (F4 and F5 are not shown in the figure). If the heavy object falls on center of the hollowed-out area 121, F2, F3, F4 and F5 are equal in magnitude. This can avoid the situation where there is only one upward reverse stress F when there is no hollowed-out area 121, that is, the hollowed-out area 121 can decompose the reverse stress F, so that the impact force can be dispersed, and a phenomenon of stress concentration can be avoided.

Specifically, the plurality of hollowed-out areas may be arranged uniformly, for example, in a matrix arrangement, or may be arranged non-uniformly, the arrangement manner of the plurality of hollowed-out areas is not limited in the present application, and may be determined according to actual conditions.

A display device is provided by an embodiment of the present application. By attaching a supporting layer with a plurality of hollowed-out areas to a flexible screen device, an impact force can be dispersed and buffered when the flexible screen device is impacted by a heavy object, damage to display components due to stress concentration can be avoided, thereby avoiding malfunction or failure of the flexible screen device.

According to an embodiment of the present application, as shown in FIG. 1, a shape of a projection of the hollowed-out area 121 on an upper surface of the supporting layer 120 is a circle, and the plurality of hollowed-out areas are arranged uniformly.

Specifically, when the shape, of the hollowed-out area 121 is a circle, the flexible screen device 110 may be subjected to reverse stresses in more directions, and magnitude of the reverse stresses in each direction is closer to equal, so that the effect of dispersing and buffering the impact force is better, thereby protecting components better. In order to further avoid the phenomenon of stress concentration caused by the heavy object falling on the flexible screen device 110, the plurality of hollowed-out areas may be arranged uniformly, such as in a matrix arrangement, and the supporting layer 120 may be filled with the hollowed-out areas within a range corresponding to the display area of the flexible screen device 110.

The shape and size of each hollowed-out area may be the same or different. For example, when the flexible screen device 110 is a planar shape, the shape and size of each hollowed-out area may be the same to avoid the phenomenon of stress concentration and ensure the stability of the display device. When the flexible screen device 110 includes a planar region and a non-planar region, the shape and size of the hollowed-out area in the non-planar region may be different from that in the planar region to buffer and disperse the impact force better.

According to an embodiment of the present application, when the shape of the projection of the hollowed-out area 121 on the upper surface of the supporting layer 120 is a circle, a diameter of the hollowed-out area 121 is within a range from 5 mm to 6 mm.

Specifically, when the diameter of the hollowed-out area 121 is too large, the impact force of the heavy object on the screen may fall into the interior of the hollowed-out area 121 completely, so that it is difficult to achieve the effect of dispersing the impact force. When the diameter of the hollowed-out area 121 is too small, a portion of the flexible screen device 110 that is in contact with the heavy object is difficult to undergo large deformation, and an angle between each reverse stress and the impact force in the opposite direction is small, that is, it is difficult to achieve the effect of buffering and dispersing the impact force. The diameter of the hollowed-out area 121 in the embodiment of the present application may be in a range from 5 mm to 6 mm. For example, the diameter may be 5 mm, 5.1 mm, 5.2 mm, 5.3 mm, 5.4 mm, 5.5 mm, 5.6 mm, 5.7 mm, 5.8 mm, 5.9 mm, or 6.0 mm. When the shape of the hollowed-out area 121 is a square, the side length of the hollowed-out area 121 may be in a range from 5 mm to 6 mm. Of course, a specific size of the hollowed-out area 121 may be determined according to actual situations.

Preferably, when the hollowed-out area 121 is a regular shape such as a circle, a square, or a regular hexagon, a distance between adjacent hollowed-out areas (that is, a distance between centers of the adjacent hollowed-out areas) may be one, one and a half, two, or the like times the diameter or side length of the hollowed-out area. If the distance is larger, the strength of the support film 120 is greater, and the supporting effect on the flexible screen 110 is more stable, but the effect of buffering and dispersing the impact force on the flexible screen is reduced. If the distance is smaller, when the flexible screen device 110 is subjected to the impact force, the protective effect of the supporting layer 120 on the flexible screen device 110 is more comprehensive, but the strength of the supporting layer 120 itself is reduced. The distance between the adjacent hollowed-out areas may be determined according to actual situations, and the present application is not limited thereto.

According to an embodiment of the present application, a thickness of the supporting layer 120 is within a range from 80 μm to 100 μm.

Specifically, since the display device may be in a bent or folded state during use, the supporting layer 120 may not be too thick, and a too thick thickness may affect bending and folding effects of the display device. In addition, the supporting layer 120 may not be too thin, because the supporting layer 120 need to have a supporting effect on the flexible screen device 110. If the supporting layer 120 is too thin, it may be difficult to achieve the supporting effect. In the embodiment of the present application, the thickness of the supporting layer 120 may be within a range from 80 μm to 100 μm, such as 80 μm, 85 μm, 90 μm, 95 μm, or 100 μm. Of course, a specific thickness of the supporting layer 120 may be determined according to actual conditions.

According to an embodiment of the present application, a material of the supporting layer 120 includes any one of polyethylene terephthalate, polybutylene terephthalate and polymethyl methacrylate.

Specifically, the material of the supporting layer may choose from engineering plastic, because the engineering plastic has good dimensional stability, good heat resistance and good mechanical strength, and may be used as the supporting layer. Preferably, the material of the supporting layer 120 in the present application is polyethylene terephthalate (PET).

Figure 1B:
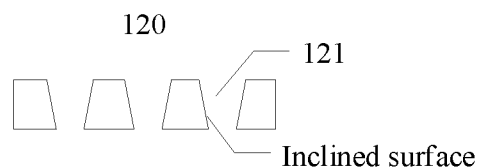
FIG. 1B is a cross section of a supporting layer according to an embodiment of the present application.

Optionally, as shown in FIG. 1B, as another embodiment, an inner wall of each of the hollowed-out areas 121 in the plurality of hollowed-out areas is an inclined surface, and a size of a cross-section on a side close to the flexible screen device 110 is larger than a size of a cross-section on a side far from the flexible screen device.

Figure 1C:
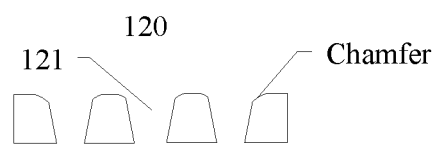
FIG. 1C is a cross section of a supporting layer according to another embodiment of the present application.

Specifically, as shown in FIG. 1C, the inner wall of the hollowed-out area 121 may be determined as the inclined surface, that is, a cross-section of the hollowed-out area 121 in a direction perpendicular to the supporting layer 120 is in a trapezoid shape, or the inner wall of the hollowed-out area 121 is provided with a chamfer at a position close to the flexible screen device 110, and an opening size of the hollowed-out area 121 close to the flexible screen device 110 is larger than an opening size far from the flexible screen device 110. In this way, while ensuring that the hollowed-out area 121 can buffer and disperse the impact force, a volume of the hollowed-out area 121 can be reduced, thereby making the supporting effect of the supporting layer 120 on the flexible screen device 110 is more stable.

According to an embodiment of the present application, the display device 100 may be a display screen device of a mobile phone. In order to meet production requirements of a full-screen mobile phone, a peripheral position of the flexible screen device 110 may be provided with a chip circuit, and a portion of the flexible screen device 110 provided with the chip circuit needs to be bent to the back of the display screen. Therefore, in order to facilitate bending the portion of the flexible screen device 110 provided with the chip circuit to the back of the display screen, the supporting layer 120 is provided with a bending hollowed-out area 122 which corresponds to a bending area of the flexible screen device 110. A shape of the bending hollowed-out area 122 may be a rectangle, an ellipse, a rhombus, a triangle, or other regular or irregular shapes.

Figure 4:
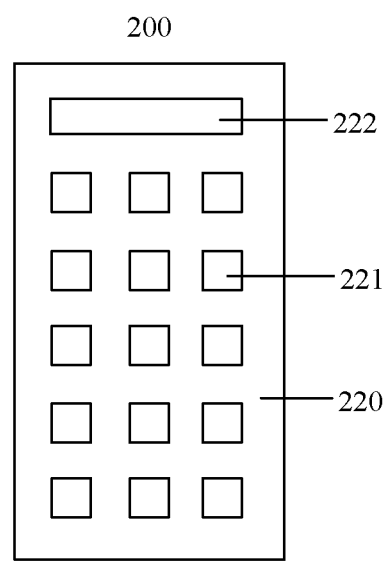
FIG. 4 is a schematic structural diagram of a display device according to another embodiment of the present application.

FIG. 4 is a schematic structural diagram of a display device 200 according to another embodiment of the present application. As shown in FIG. 4, the display device 200 is similar to the display device 100, and similarities are not be described redundantly herein. Differences are that a shape of the hollowed-out area 221 of the supporting layer 220 is a square, and a side length of the hollowed-out area 221 may be within a range from 5 mm to 6 mm. In addition, a peripheral position of the supporting layer 220 may also be provided with a bending hollowed-out area 222 to meet production requirements of the full-screen mobile phone.

Figure 5:
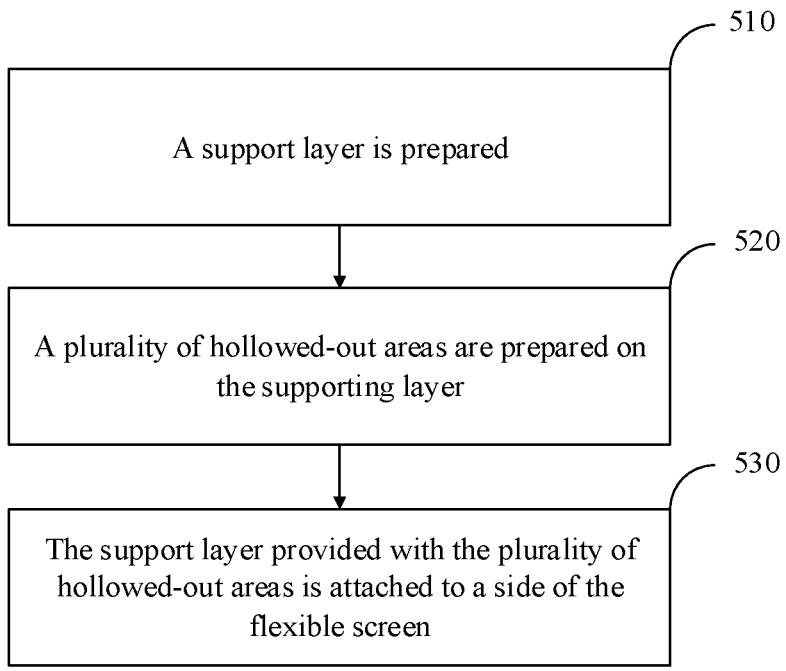
FIG. 5 is a schematic flow chart of a manufacture method of a display device according to an embodiment of the present application.

FIG. 5 is a schematic flow chart of a manufacture method of a display device according to an embodiment of the present application. As shown in FIG. 5, the manufacture method includes the following.

510: a supporting layer is prepared.

Specifically, the supporting layer may be prepared on a substrate first, and then the supporting layer may be removed from the substrate, so that the supporting layer can be attached to a side of a flexible screen device later. A type of the substrate may be selected based on actual conditions. For example, the substrate may be a glass substrate.

The preparation method of the supporting layer may be adopted from any one of the following: a calendering method, a casting method, a blow molding method, a stretching method, and so on.

520: a plurality of hollowed-out areas are prepared on the supporting layer.

Specifically, after the supporting layer is prepared OR the substrate, the plurality of hollowed-out areas are further prepared on the supporting layer. After the hollowed-out areas are prepared, the supporting layer is removed from the substrate.

The method of preparing the hollowed-out areas on the supporting layer may be a laser drilling method, a die cutting method, or the like.

A shape of the hollowed-out areas may be a rectangle, a square, a circle, or the like, and the present application is not limited thereto.

530: the supporting layer provided with the plurality of hollowed-out areas is attached to a side of a flexible screen device, and the plurality of hollowed-out areas are used to release an impact force when the flexible screen device is subjected to the impact force.

A specific structure and function of the supporting layer and a structure of the flexible screen device may be referred to the description of FIG. 1 to FIG. 4. In order to avoid repetition, they are not described redundantly herein.

According to an embodiment of the present application, after the supporting layer is prepared on the substrate, the supporting layer may be removed from the substrate first, then the supporting layer is attached to a side of the flexible screen device, and finally the plurality of hollowed-out areas are provided on the supporting layer by a method such as a laser drilling method, a die cutting method, or the like.

A display device is provided by an embodiment of the present application. By attaching a supporting layer with a plurality of hollowed-out areas to a flexible screen device, an impact force can be dispersed and buffered when the flexible screen device is impacted by a heavy object, damage to display components due to stress concentration can be avoided, thereby avoiding malfunction or failure of the flexible screen device.

Figure 6:
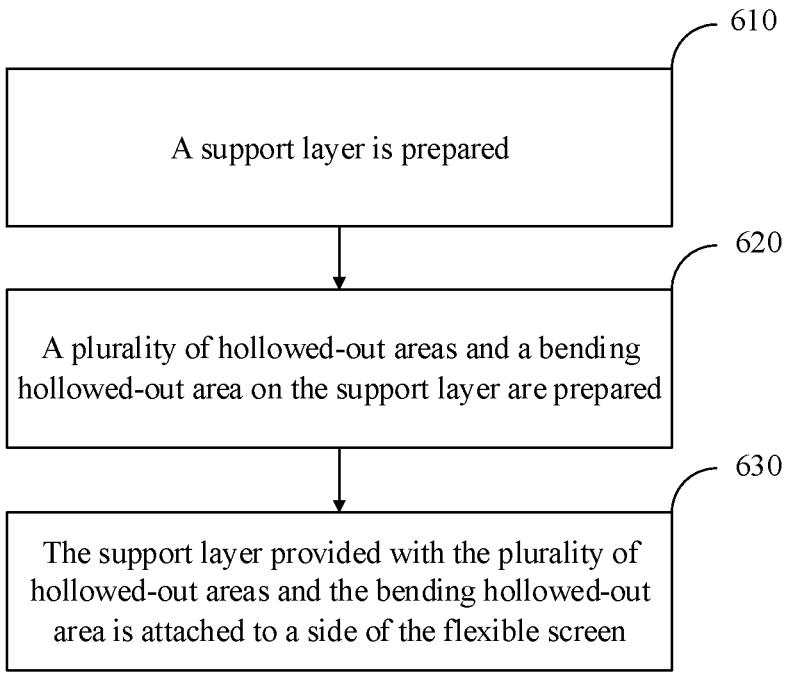
FIG. 6 is a schematic flow chart of a manufacture method of a display device according to another embodiment of the present application.

FIG. 6 is a schematic flow chart of a manufacture method of a display device according to another embodiment of the present application. The display device may be a display screen device of a mobile phone. As shown in FIG. 6, the manufacture method includes the following.

610: a supporting layer is prepared.

The preparation process of the supporting layer may be referred to the description in FIG. 5, and it is not described redundantly herein.

620: a plurality of hollowed-out areas and a bending hollowed-out area on the supporting layer are prepared.

A shape of the hollowed-out area (for releasing stress, which may also be called stress-release hollowed-out area) may be a rectangle, a square, a circle, or the like. A shape of the bending hollowed-out area may be a rectangle, an ellipse, or other shapes, and the present application is not limited thereto.

630: the supporting layer provided with the plurality of hollowed-out areas and the bending hollowed-out area is attached to a side of the flexible screen device.

The plurality of hollowed-out areas are used to release an impact force when the flexible screen device is subjected to the impact force. The bending hollowed-out area is used to bend the portion of the flexible screen device encapsulated with a chip circuit to a side close to the supporting layer more easily when making the full-screen mobile phone.

A specific process of the dispersing and buffering effect of the hollowed-out area on the impact force may be referred to the description of the method section above, and it is not described redundantly herein.

The above are only the preferred embodiments of the present application and are not intended to limit the present application. Any modifications, equivalent substitutions and so on made within the spirit and principle of the present application should be included within the scope of the present application.

What is claimed is:

1. A supporting layer, attached to a back side of a flexible screen device opposite to a display side of the flexible screen device and having a certain mechanical strength to support the flexible screen device, comprising:
    at least one hollowed-out area releasing an impact force when the display side of the flexible screen device is subjected to the impact force; and
    a bending hollowed-out area which corresponds to a bending area of the flexible screen device provided with a chip circuit.

2. The supporting layer according to claim 1, wherein the at least one hollowed-out area is a plurality of hollowed-out areas.

3. The supporting layer according to claim 2, wherein a shape of a projection of each of the plurality of hollowed-out areas on an upper surface of the supporting layer is any one of a circle, a rectangle, a triangle, a rhombus, a pentagon, a hexagon and an ellipse.

4. The supporting layer according to claim 3, wherein the shape of the projection of the hollowed-out area on the upper surface of the supporting layer is the circle, a diameter of the hollowed-out area is within a range from 5 mm to 6 mm; and the plurality of hollowed-out areas are arranged uniformly.

5. The supporting layer according to claim 1, wherein a thickness of the supporting layer is within a range from 80 μm to 100 μm.

6. The supporting layer according to claim 1, wherein a material of the supporting layer comprises at least one of polyethylene terephthalate, polybutylene terephthalate and polymethyl methacrylate.

7. The supporting layer according to claim 1, wherein an inner wall of each of the plurality of hollowed-out areas is an inclined surface, and a size of a cross-section on a side close to the flexible screen device is larger than a size of a cross-section on a side far from the flexible screen device.

8. The supporting layer according to claim 1, wherein the inner wall of each of the at least one hollowed-out area is provided with a chamfer at a position close to the flexible screen device.

9. A display device, comprising:
    the flexible screen device according to claim 1; and
    the supporting layer according to claim 1, wherein the supporting layer is attached to the back side of the flexible screen device opposite to the display side of the flexible screen device.

10. A manufacture method of the display device according to claim 9, comprising:
    preparing the supporting layer;
    preparing the at least one hollowed-out area on the supporting layer, and preparing the bending hollowed-out area on the supporting layer;
    providing the flexible screen device, and attaching the supporting layer provided with the at least one hollowed-out area and the bending hollowed-out area to the back side of the flexible screen device opposite to the display side of the flexible screen device, wherein the bending hollowed-out area corresponds to the bending area of the flexible screen device provided with the chip circuit.

11. The manufacture method of the display device according to claim 10, wherein the at least one hollowed-out area is a plurality of hollowed-out areas.

12. The manufacture method according to claim 10, wherein the preparing the at least one hollowed-out area on the supporting layer comprises:
    preparing the at least one hollowed-out area on the supporting layer by a laser drilling or a die cutter cutting.

13. The manufacture method according to claim 11, wherein a shape of a projection of each of the plurality of hollowed-out areas on an upper surface of the supporting layer is any one of a circle, a rectangle, a triangle, a rhombus, a pentagon, a hexagon and an ellipse.

14. The manufacture method according to claim 13, wherein the shape of the projection of the hollowed-out area on the upper surface of the supporting layer is the circle, a diameter of the hollowed-out area is within a range from 5 mm to 6 mm; and the hollowed-out areas are arranged uniformly.

15. The manufacture method according to claim 10, wherein a thickness of the supporting layer is within a range from 80 μm to 100 μm.

16. The manufacture method according to claim 10, wherein a material of the supporting layer comprises at least one of polyethylene terephthalate, polybutylene terephthalate and polymethyl methacrylate.

17. The manufacture method according to claim 11, wherein an inner wall of each of the plurality of hollowed-out areas is an inclined surface, and a size of a cross-section on a side close to the flexible screen device is larger than a size of a cross-section on a side far from the flexible screen device.

18. The manufacture method according to claim 10, wherein the inner wall of each of the at least one hollowed-out area is provided with a chamfer at a position close to the flexible screen device.

19. The supporting layer according to claim 1, wherein a material of the supporting layer is engineering plastic.

* * * * *